(12) United States Patent
Zanbaghi

(10) Patent No.: US 8,643,524 B1
(45) Date of Patent: Feb. 4, 2014

(54) FEED-FORWARD ANALOG-TO-DIGITAL CONVERTER (ADC) WITH A REDUCED NUMBER OF AMPLIFIERS AND FEED-FORWARD SIGNAL PATHS

(71) Applicant: Cirrus Logic, Inc., Austin, TX (US)

(72) Inventor: Ramin Zanbaghi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 8 days.

(21) Appl. No.: 13/628,855

(22) Filed: Sep. 27, 2012

(51) Int. Cl.
*H03M 3/00* (2006.01)

(52) U.S. Cl.
USPC ............................ 341/143; 341/155; 341/172

(58) Field of Classification Search
USPC .......................................... 341/155, 143, 172
See application file for complete search history.

(56) References Cited

U.S. PATENT DOCUMENTS

| | | | |
|---|---|---|---|
| 4,099,122 A | 7/1978 | van Buul | |
| 4,223,389 A | 9/1980 | Amada et al. | |
| 4,920,507 A | 4/1990 | Takeda | |
| 5,347,279 A | 9/1994 | Ishihara et al. | |
| 5,357,252 A | 10/1994 | Ledzius et al. | |
| 5,471,209 A | 11/1995 | Sutterlin et al. | |
| 5,495,200 A | 2/1996 | Kwan et al. | |
| 5,736,895 A | 4/1998 | Yu et al. | |
| 5,959,562 A * | 9/1999 | Wiesbauer | 341/143 |
| 5,977,899 A | 11/1999 | Adams | |
| 5,982,316 A | 11/1999 | Shin | |
| 6,201,835 B1 | 3/2001 | Wang | |
| 6,437,719 B1 | 8/2002 | Noro et al. | |
| 6,473,019 B1 * | 10/2002 | Ruha et al. | 341/143 |
| 6,608,581 B1 | 8/2003 | Semenov | |
| 6,670,902 B1 | 12/2003 | Melanson et al. | |
| 6,674,381 B1 | 1/2004 | Gomez et al. | |
| 6,738,004 B2 | 5/2004 | Melanson | |
| 6,744,392 B2 | 6/2004 | Melanson | |
| 6,819,723 B1 | 11/2004 | Wu et al. | |
| 6,822,593 B2 | 11/2004 | Level et al. | |
| 6,873,276 B2 | 3/2005 | Yang et al. | |
| 6,924,757 B2 | 8/2005 | Adams et al. | |
| 6,956,514 B1 | 10/2005 | Melanson et al. | |
| 7,006,023 B2 * | 2/2006 | Chen | 341/143 |

(Continued)

OTHER PUBLICATIONS

Zanbaghi, Ramin, et al. "A 75dB SNDR, 10MHz Conversion Bandwidth Stage-Shared 2-2 Mash ΔΣ Modulator dissipating 9mW", Custom Integrated Circuits Conference (CICC), 2011 IEEE, Sep. 19-21, 2011, San Jose, CA.

(Continued)

*Primary Examiner* — Jean B Jeanglaude
(74) *Attorney, Agent, or Firm* — Andrew M. Harris; Mitch Harris, Atty at Law, LLC

(57) ABSTRACT

An analog-to-digital converter (ADC) having a reduced number of amplifiers and feed-forward signal paths provides for reduced complexity and power consumption. The analog-to-digital converter includes a delta-sigma modulator having a loop filter with second-order stages implemented with a single amplifier each, provided by a series-connected capacitive feedback network with a switched capacitor shunt. The reduction in the amplifier stages reduces the number of inputs to, and dynamic range required from, the summing node that provides input to the quantizer, as well as reducing the power requirements and complexity of the circuit due to the reduced number of amplifiers.

18 Claims, 4 Drawing Sheets

(56) References Cited

U.S. PATENT DOCUMENTS

| | | | |
|---|---|---|---|
| 7,034,729 B2 * | 4/2006 | Gaggl et al. | 341/143 |
| 7,062,340 B2 | 6/2006 | Melanson | |
| 7,142,142 B2 | 11/2006 | Petersen et al. | |
| 7,158,063 B2 | 1/2007 | Motz et al. | |
| 7,298,305 B2 | 11/2007 | Melanson | |
| 7,375,666 B2 | 5/2008 | Melanson | |
| 7,423,567 B2 | 9/2008 | Melanson | |
| 7,660,839 B1 | 2/2010 | Melanson | |
| 7,916,054 B2 * | 3/2011 | Baker | 341/143 |
| 8,130,127 B1 * | 3/2012 | Tsang et al. | 341/143 |
| 2003/0227401 A1 * | 12/2003 | Yang et al. | 341/143 |

OTHER PUBLICATIONS

Zanbaghi, Ramin, et al. "A 75-dB SNDR, 5-MHz Bandwidth Stage-Shared 2-2 Mash ΔΣ Modulator Dissipating 16 m W Power", IEEE Transactions on Circuits and Systems I: Regular Papers, Aug. 2012, pp. 1614-1625, vol. 59, No. 8, Piscataway, NJ.

Roberts, Richard A. and Mullins, Clifford T. "Digital Signal Processing", Addison-Wesley, Reading, MA, 1987, pp. 297-316.

Colodro, et al., "New Dual-Quantization Multibit Sigma-Delta Modulators with Digital Noise Shaping", Proceedings of the 2003 International Symposium on Circuits and Systems, 2003, ICAS '03, vol. 1, May 25, 2003, pp. I-1053-I-1056.

* cited by examiner

FEED-FORWARD ANALOG-TO-DIGITAL CONVERTER (ADC) WITH A REDUCED NUMBER OF AMPLIFIERS AND FEED-FORWARD SIGNAL PATHS

BACKGROUND OF THE INVENTION

1. Field of the Invention

The present invention relates generally to analog-to-digital converters (ADCs), and more specifically, to a feed-forward ADC having a reduced number of amplifiers and feed-forward signal paths.

2. Background of the Invention

Delta-sigma modulators are in widespread use in ADCs and digital-to-analog converters DACs, in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

The delta-sigma modulator based ADC includes a loop filter that receives an input signal and a quantizer that converts the output of the loop filter to a digital representation. Feedback from the quantizer output is applied to each integrator in the loop filter for feedback modulator topologies or only to the input of the loop filter for feed-forward modulator topologies. The feedback provided from the quantizer is typically generated by a coarse feedback DAC that receives the digital output of the quantizer and generates an analog value that is provided to the loop filter. The feedback provides a closed-loop that causes the time-average value of the output of the quantizer to accurately represent the value of the modulator input signal. The loop filter provides shaping of the quantization noise at the output of the quantizer in response to the feedback signal applied from the quantizer to the loop filter.

The loop filter in the feed-forward topology described above typically requires a summer that combines signals from each of a plurality of analog integrator states that are connected in cascade. The input of the cascade receives the input signal to be converted and the output of the summer provides the input to a the quantizer that digitizes the input signal. Each of the integrator stages requires an amplifier. The summer that sums the integrator output signals to generate the quantizer input must handle a combination of the maximum deviation of each of the outputs integrator stages. All of the components listed above contribute to increased power consumption and die area usage. Therefore, it would be desirable to provide an ADC using a delta-sigma modulator having a reduced number of amplifiers. It would further be desirable to provide a feed-forward delta-sigma modulator-based ADC having a reduced dynamic range requirement and power consumption at the summer.

SUMMARY OF THE INVENTION

The above stated objective of reducing the number of amplifiers in a delta-sigma modulator-based ADC and reducing the dynamic range and power consumption of the output summer is achieved in an ADC circuit and its method of operation.

The analog-to-digital converter includes a loop filter that provides an output to a quantizer input. The output of the quantizer is provided to a digital integrator that provides the output of a delta-sigma modulator. The loop filter includes at least one switched-capacitor integrator stage that achieves a second-order operation by including a capacitive feedback network connected from an output of an amplifier of the at least one switched-capacitor integrator stage to an input of the amplifier. The capacitive feedback network includes at least two capacitors coupled in series at a common terminal that is intermittently coupled to a reference voltage source by a switched-capacitor shunt network.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing the number of amplifiers in the loop filter of a feed-forward delta-sigma modulator based analog-to-digital converter (ADC). Reducing the number of amplifiers and feed-forward paths in the loop filter reduces circuit complexity and power consumption of converters incorporating delta-sigma modulators that use the techniques disclosed herein.

Figure 1:
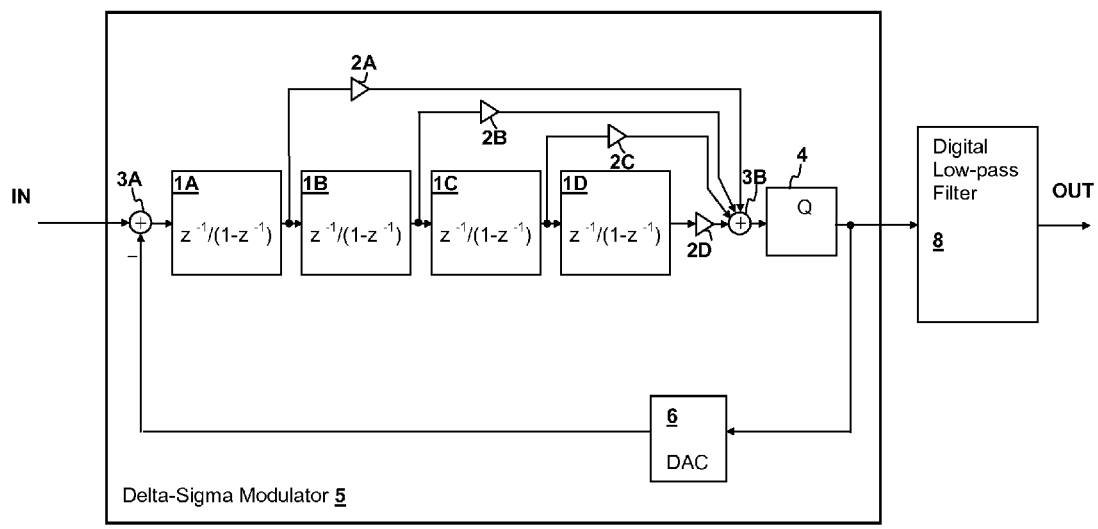
FIG. 1 is a block diagram depicting a prior art ADC topology.

FIG. 1 shows a z-transform model of a prior art feed-forward ADC including a delta-sigma modulator 5 of typical design. Delta-sigma modulator 5 has an input IN and provides a noise-shaped output provided from a quantizer 4 that quantizes the output of a loop filter that includes multiple integrator stages 1A-1D, each with a corresponding one of scaling multipliers 2A-2D. The feed-forward paths provided from the outputs of each of scaling multipliers 2A-2D are summed by a combiner 3B, which provides the analog value that is quantized by quantizer 4. The time average value of the output of quantizer 4 represents the value of input IN, which is enforced by a feedback loop comprising digital-to-analog converter (DAC) 6 and a combiner 3A that subtracts the feedback value from the value of input IN to generate the error value provided to the input of the loop filter formed by integrator stages 1A-1D. A digital low-pass filter 8 removes high-frequency components from the output of quantizer 4, yielding a digital representation of input signal IN.

Figure 2A:
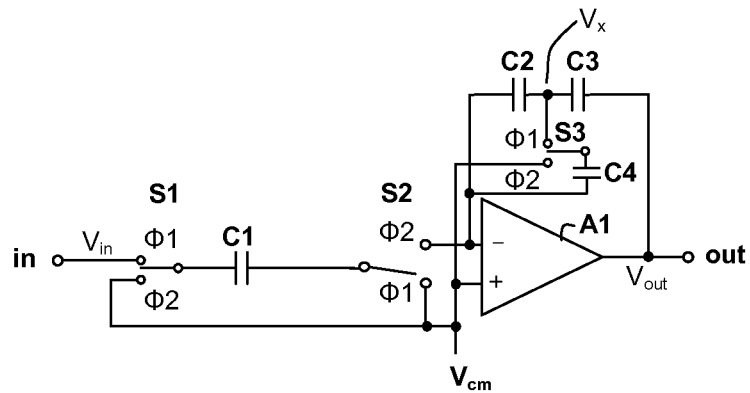
FIG. 2A is a circuit diagram depicting a switched-capacitor stage.

FIG. 2A shows a new switched capacitor stage, which when used in a feed-forward ADC, results in a reduction of the number of amplifiers required in the loop filter for a particular loop filter order, and also reduces the number of feed-forward paths combined prior to quantization. A switched-capacitor input network formed by capacitor C1, switch S1 and switch S2, is operated by clock signal phases φ1 and φ2 to sample input signal in and transfer charge to the summing node of an amplifier A1. A capacitive feedback network consisting of two series-connected capacitors C2 and C3 integrates the charge provided by the switched-capacitor input network and further includes a capacitor C4 that is intermittently connected to reference voltage $V_{CM}$ by a switching circuit S3, which is operated by clock signal phases φ1 and φ2 to provide a shunting switched capacitor circuit from the common connection of capacitors C2 and C3 to reference voltage $V_{CM}$.

If the capacitance values of capacitors C1-C4 are assigned as c1-c4, respectively, and $V_{in}$ is the voltage of input in and $V_{out}$ is the voltage of output out, then the value of voltage $V_{out}$ is given by:

$$V_{out} = -V_{in} * c1/(c2*c3) * [(c2+c3+c4)-(c2+c3)z^{-1}]/(1-z^{-1})^2$$

If the intermediate node connecting capacitors C2 and C3 is assigned voltage $V_x$ then:

$$V_x/V_{in} = -c1/c1 * z^{-1}/(1-z^{-1}) = -z^{-1}/(1-z^{-1}) \text{ and therefore}$$

$$V_{out} = -c1/(c2*c3) * [V_{in}*(c2+c3+c4)/(1-z^{-1}) - V_x*(c2+c3)]/(1-z^{-1}).$$

Figure 2B:
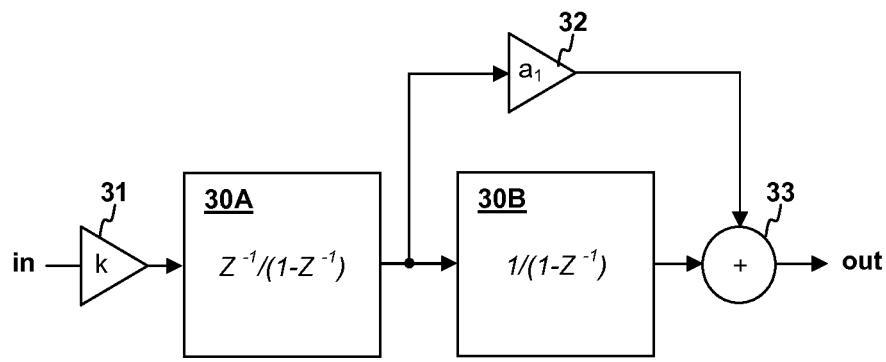
FIG. 2B is a circuit diagram depicting a z-transform model of the switched-capacitor stage of FIG. 2A.

FIG. 2B shows a Z-transform model of the switched-capacitor circuit depicted in FIG. 2A. A scaling multiplier 31 applies scaling constant k to input signal in and a first integrator 30A and second integrator 30B provide for integration of value k*in, with first integrator 30A and second integrator 30B providing a second-order integration of value k*in, resulting in an output value from second integrator 30B of:

$$V_{out} = k*V_{in}*z^{-1}/(1-Z^{-1})^2$$

which is combined by a combiner 33 with the output of integrator 30A scaled by scaling multiplier 32 yielding $$a_1*k*V_{in}*z^{-1}/(1-Z^{-1})$$

Combiner 33 combines the two values above, resulting in output value:

$$V_{out} = k*V_{in}*z^{-1}(1-z^{-1})^2 + a_1*k*V_{in}*z^{-1}/(1-z^{-1})$$

when the intermediate voltage $V_x$ is assigned to the output of integrator 30A, then the above can be re-written as:

$$V_{out} = k*[V_x/(1-z^{-1}) + a_1*V_{in}*z^{-1}/(1-z^{-1})]$$

which when compared with the equation describing the circuit of FIG. 2A above:

$$V_{out} = c1/(c2*c3) * [V_{in}*(c2+c3+c4)/(1-z^{-1}) - V_x*(c2+c3)]/(1-z^{-1}).$$

shows equivalence of operation when k=c1*(C2+C3)/(c2*c3) and $a_1$=(c2+c3+c4)/(c2+c3).

Figure 3:
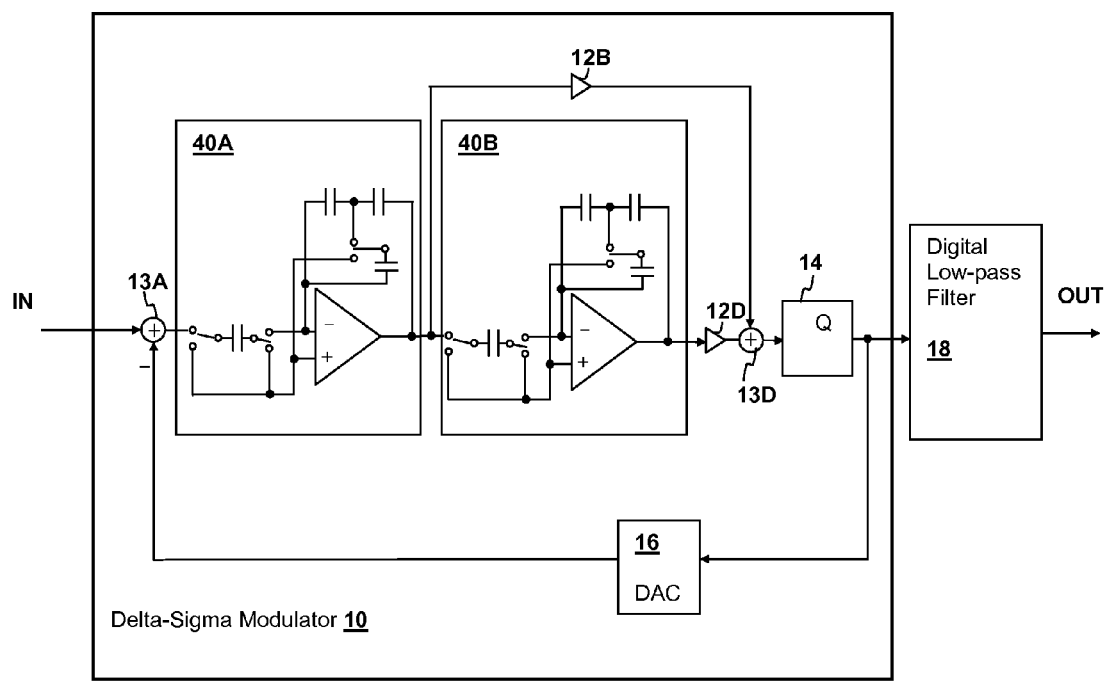
FIG. 3 is a block diagram depicting an ADC in which the switched-capacitor stage of FIG. 2A is applied.

FIG. 3 shows an ADC circuit that includes a delta-sigma modulator 10 constructed with the above-described switched-capacitor second-order integrator stage. A delta-sigma modulator 10 has an input IN and provides a noise-shaped output provided from a quantizer 14 that quantizes the output of a loop filter that includes two second-order integrator stages 40A and 40B each with a structure as shown in FIG. 2A. A scaling multiplier 12B scales the feed-forward path provided from the output of the first integrator stage 40A, and a scaling multiplier 12D scales the second feed-forward path from the output of second integrator stage 40B. The two feed-forward paths are summed by a combiner 13D, which provides the analog value that is quantized by quantizer 14. The time average value of the output of quantizer 14 represents the value of input IN, which is enforced by a feedback loop comprising digital-to-analog converter (DAC) 16 and a combiner 13A that subtracts the feedback value from the value of input IN to generate the error value provided to the input of the loop filter formed by integrator stages 40A and 40B. A digital low-pass filter 18 removes high-frequency components from the output of quantizer 14, yielding a digital representation of input signal IN. While only two feed-forward paths are included, and only two integrator stages 40A, 40B each having a single amplifier, the loop filter in the ADC of FIG. 3 is fourth-order, due to the inclusion of second-order integrator stages 40A,40B.

Figure 4:
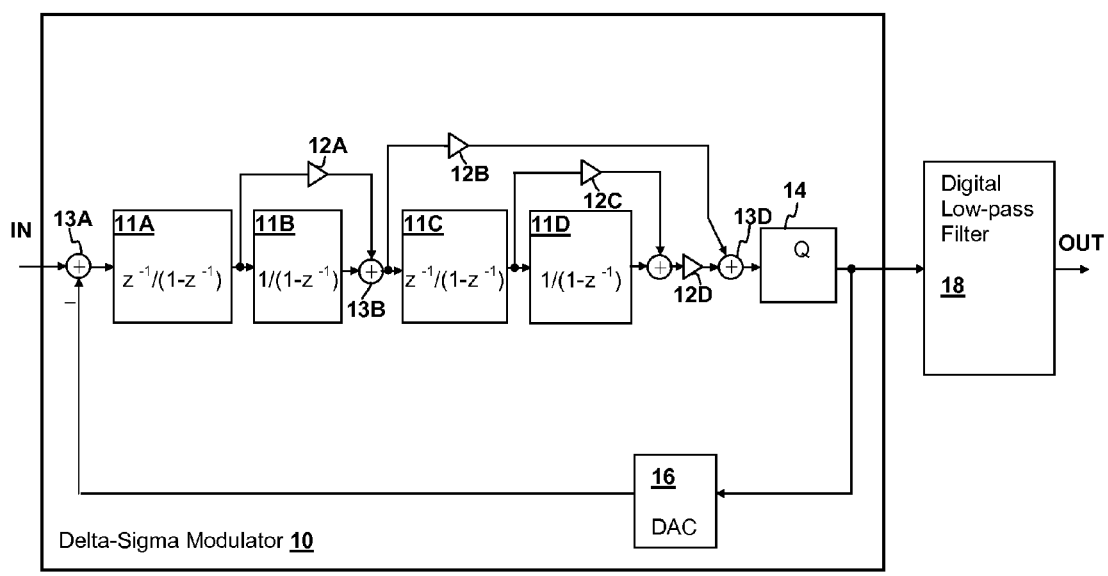
FIG. 4 is a circuit diagram depicting a z-transform model of the ADC depicted in FIG. 3.

FIG. 4 shows a z-transform representation of the ADC of FIG. 3. The model depicted in FIG. 4 is similar to the circuit depicted in FIG. 3, so only differences between them will be described below. As in the depiction of FIG. 2B, each of second-order integrator stages 40A,40B can be replaced with a pair of integrator stages with appropriate scaling and summing. Second-order integrator stage 40A is modeled as a cascade of first-order integrators 11A and 11B and a combiner 13B that sums the local feed-forward path from integrator 11A as scaled by scaling multiplier 12A. Similarly, second-order integrator stage 40B is modeled as a cascade of first-order integrators 11C and 11D and a combiner 13D that sums the local feed-forward path from integrator 11C as scaled by scaling multiplier 12C.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A delta-sigma modulator circuit, comprising:
   a loop filter comprising a plurality of cascaded single op-amp switched-capacitor integrator stages, wherein at least one of the switched-capacitor integrator stages has a switched capacitor input network coupled to an input terminal of the loop filter and to the input of the amplifier and operated according to a clock, a capacitive feedback network connected from an output of an amplifier of the at least one switched-capacitor integrator stage to an input of the amplifier, wherein the capacitive feedback network includes at least two capacitors coupled in series at a common terminal, wherein the common terminal is coupled to a reference voltage source by a switched-capacitor shunt network operated according to the clock; and
   a quantizer having an input coupled to the output of the loop filter and an output coupled to an input of the loop filter, wherein the delta-sigma modulator noise-shapes a signal provided to a second input of the loop filter as represented in an average value of the output of the quantizer.

2. The delta-sigma modulator circuit of claim 1, wherein the capacitive feedback network comprises:
   a first capacitor having a first terminal connected to the input of the amplifier;
   a second capacitor having a first terminal connected to a second terminal of the first capacitor and a second terminal connected to the output of the amplifier; and
   a third capacitor intermittently coupled between the first terminal of the second capacitor and the reference voltage source according a state of a first phase of the clock.

3. The delta-sigma modulator circuit of claim 2, wherein the first phase of the clock also selects charging of the switched-capacitor input network from the input terminal.

4. The delta-sigma modulator circuit of claim 3, wherein a second phase of the clock that does not overlap with the first phase of the clock selects charging of the input of the amplifier from the switched-capacitor input network.

5. An analog-to-digital converter (ADC), comprising:
a loop filter comprising a plurality of cascaded single op-amp switched-capacitor integrator stages, wherein at least one of the switched-capacitor integrator stages has a switched capacitor input network coupled to an input terminal of the ADC and to the input of the amplifier and operated according to a clock, a capacitive feedback network connected from an output of an amplifier of the at least one switched-capacitor integrator stage to an input of the amplifier, wherein the capacitive feedback network includes at least two capacitors coupled in series at a common terminal, wherein the common terminal is coupled to a reference voltage source by a switched-capacitor shunt network operated according to the clock;
a feed-forward network providing feed-forward signals from outputs of at least some of the plurality of cascaded switched-capacitor integrator stages;
a summing block for summing the feed-forward signals to generate an output; and
a quantizer having an input coupled to the output of the summing block, wherein the feed-forward network provides a predetermined number of feed-forward signals to the summing block.

6. The ADC of claim 5, wherein the capacitive feedback network comprises:
a first capacitor having a first terminal connected to the input of the amplifier;
a second capacitor having a first terminal connected to a second terminal of the first capacitor and a second terminal connected to the output of the amplifier; and
a third capacitor intermittently coupled between the first terminal of the second capacitor and the reference voltage source according a state of a first phase of the clock.

7. The ADC of claim 6, wherein the first phase of the clock also selects charging of the switched-capacitor input network from the input terminal.

8. The ADC of claim 7, wherein a second phase of the clock that does not overlap with the first phase of the clock selects charging of the input of the amplifier from the switched-capacitor input network.

9. The ADC of claim 5, wherein a number of the feed-forward signals provided to the input of the summing block including the output of a final stage of the loop filter is less than an order of the loop filter.

10. The ADC of claim 9, wherein the number of the feed-forward signals is exactly half of the order of the loop filter.

11. A switched capacitor integrator stage, comprising:
an input terminal for receiving an input voltage;
an amplifier;
a switched capacitor input network coupled to the input terminal and to the input of the amplifier and operated according to a clock;
a capacitive feedback network connected from an output of an amplifier of the at least one switched-capacitor integrator stage to an input of the amplifier, wherein the capacitive feedback network includes at least two capacitors coupled in series at a common terminal; and
a switched-capacitor shunt network operated according to the clock coupled between the common terminal and a reference voltage source.

12. The switched capacitor integrator stage of claim 11, wherein the capacitive feedback network comprises:
a first capacitor having a first terminal connected to the input of the amplifier;
a second capacitor having a first terminal connected to a second terminal of the first capacitor and a second terminal connected to the output of the amplifier; and
a third capacitor intermittently coupled between the first terminal of the second capacitor and the reference voltage source according a state of a first phase of the clock.

13. The switched capacitor integrator stage of claim 12, wherein the first phase of the clock also selects charging of the switched-capacitor input network from the input terminal.

14. The switched capacitor integrator stage of claim 13, wherein a second phase of the clock that does not overlap with the first phase of the clock selects charging of the input of the amplifier from the switched-capacitor input network.

15. A method of operating a delta-sigma modulator, comprising:
noise-shaping an input and a feedback signal with a loop filter formed by a plurality of cascaded integrator stages, wherein at least one of the plurality of cascaded integrator stages includes a switched capacitor input network coupled to an input terminal of the ADC and to the input of the amplifier and operated according to a clock, a capacitive feedback network connected from an output of an amplifier of the at least one switched-capacitor integrator stage to an input of the amplifier, wherein the capacitive feedback network includes at least two capacitors coupled in series at a common terminal, wherein the common terminal is coupled to a reference voltage source by a switched-capacitor shunt network operated according to the clock;
quantizing a result of said noise-shaping to provide an output signal; and
providing feedback of said quantizing to said noise-shaping as said feedback signal.

16. The method of claim 15, wherein the capacitive feedback network comprises:
a first capacitor having a first terminal connected to the input of the amplifier;
a second capacitor having a first terminal connected to a second terminal of the first capacitor and a second terminal connected to the output of the amplifier; and
a third capacitor intermittently coupled between the first terminal of the second capacitor and the reference voltage source according to a state of a first phase of the clock.

17. The method of claim 16, wherein the first phase of the clock also selects charging of the switched-capacitor input network from the input terminal.

18. The method of claim 17, wherein a second phase of the clock that does not overlap with the first phase of the clock selects charging of the input of the amplifier from the switched-capacitor input network.

* * * * *